United States Patent
Kobayashi et al.

(10) Patent No.: US 10,651,057 B2
(45) Date of Patent: May 12, 2020

(54) APPARATUS AND METHOD FOR CLEANING A BACK SURFACE OF A SUBSTRATE

(71) Applicant: EBARA CORPORATION, Tokyo (JP)

(72) Inventors: Kenichi Kobayashi, Tokyo (JP); Yu Ishii, Tokyo (JP); Keisuke Uchiyama, Tokyo (JP)

(73) Assignee: EBARA CORPORATION, Tokyo (JP)

(*) Notice: Subject to any disclaimer, the term of this patent is extended or adjusted under 35 U.S.C. 154(b) by 378 days.

(21) Appl. No.: 15/583,327

(22) Filed: May 1, 2017

(65) Prior Publication Data

US 2018/0315622 A1   Nov. 1, 2018

(51) Int. Cl.
| | |
|---|---|
| H01L 21/02 | (2006.01) |
| H01L 21/67 | (2006.01) |
| B08B 1/00 | (2006.01) |
| H01L 21/304 | (2006.01) |
| B08B 3/04 | (2006.01) |
| B08B 1/04 | (2006.01) |

(52) U.S. Cl.
CPC ........ *H01L 21/67028* (2013.01); *B08B 1/006* (2013.01); *B08B 1/007* (2013.01); *B08B 1/04* (2013.01); *B08B 3/04* (2013.01); *H01L 21/0209* (2013.01); *H01L 21/304* (2013.01); *H01L 21/67046* (2013.01); *H01L 21/67051* (2013.01)

(58) Field of Classification Search
CPC ....... H01L 21/461; H01L 21/68; H01L 21/02; H01L 21/6728
See application file for complete search history.

(56) References Cited

U.S. PATENT DOCUMENTS

| | | |
|---|---|---|
| 6,379,230 B1 | 4/2002 | Hayashi et al. |
| 2002/0098787 A1 | 7/2002 | Kunisawa et al. |
| 2011/0312247 A1 | 12/2011 | Nakamori et al. |
| 2014/0220866 A1 | 8/2014 | Ishii et al. |
| 2014/0242885 A1* | 8/2014 | Nakao ............... B24B 37/345 451/57 |
| 2015/0133032 A1 | 5/2015 | Kubo et al. |
| 2015/0179484 A1 | 6/2015 | Ishibashi |

FOREIGN PATENT DOCUMENTS

| | | |
|---|---|---|
| JP | 2001-135604 A | 5/2001 |
| JP | 2003-001199 A | 1/2003 |
| JP | 2013-089797 A | 5/2013 |
| JP | 2013-214737 A | 10/2013 |
| JP | 2014-003080 A | 1/2014 |
| JP | 2014-150178 A | 8/2014 |
| WO | WO 2005/098919 A1 | 10/2005 |

OTHER PUBLICATIONS

European Patent Application No. 17168788.2; Extended Search Report; dated Oct. 6, 2017; 10 pages.

* cited by examiner

*Primary Examiner* — Michael D Jennings
(74) *Attorney, Agent, or Firm* — BakerHostetler

(57) ABSTRACT

An apparatus which can remove particles, such as polishing debris, from a back surface with high removal efficiency is provided. The apparatus includes: a substrate holder configured to rotate the substrate while holding the substrate with the back surface facing upward; a scrub cleaning tool configured to be rotatable; a two-fluid nozzle disposed above the substrate holder; and a housing defining a cleaning chamber in which the substrate holder, the scrub cleaning tool, and the two-fluid nozzle are located.

12 Claims, 11 Drawing Sheets

APPARATUS AND METHOD FOR CLEANING A BACK SURFACE OF A SUBSTRATE

BACKGROUND

Devices, such as memory circuits, logic circuits and image sensors (e.g. CMOS sensors), are becoming more highly integrated these days. In a process for forming such a device, foreign matter, such as fine particles and dust, may sometimes adhere to the device. Foreign matter adhering to a device can cause short-circuit between interconnects or can cause a circuit defect. Therefore, in order to enhance the reliability of the device, it is necessary to clean a wafer having devices formed thereon so as to remove the foreign matter from the wafer. The above-described foreign matter, such as fine particles and dust, can adhere also to the back surface (non-device surface) of a wafer. If such foreign matter adheres to the back surface of the wafer, the wafer can separate from or become inclined with respect to a stage reference surface in an exposure apparatus, resulting in patterning deviation or deviation of focal distance.

In order to prevent such problems, it is necessary to remove foreign matter adhering to a back surface of a wafer. However, it has been difficult for a conventional cleaning technique, which involves scrub-cleaning a wafer with a pen-type brush or a roll sponge while rotating the wafer, to remove foreign matter covered with a film deposited thereon or to remove foreign matter from the entire back surface of the wafer. In order to address such problem, a technique has recently been proposed which can remove with high removal efficiency foreign matter not only from a bevel portion and a peripheral portion of the back surface of a substrate, such as a wafer, but from the entire back surface of the substrate.

This new technique involves rubbing a polishing tool against a back surface of a wafer to slightly scrape off the back surface, and can therefore remove foreign matter from the back surface with high removal efficiency. However, even when cleaning of the back surface of the wafer is performed by a conventional method after the polishing of the back surface, polishing debris may remain on the back surface of the wafer. After the wafer is dried, such polishing debris may leave the wafer in a wafer cassette and fall onto another wafer in the wafer cassette.

SUMMARY OF THE INVENTION

According to embodiments, there are provided an apparatus and a method which can remove particles, such as polishing debris, from a back surface of a substrate, such as a wafer, with high removal efficiency. Further, according to an embodiment, there is provided a substrate processing apparatus for polishing a back surface of a substrate such as a wafer, and cleaning the back surface.

Embodiments, which will be described below, relate to an apparatus and a method for cleaning a back surface of a substrate, such as a wafer.

In an embodiment, there is provided an apparatus for cleaning a back surface of a substrate, comprising: a substrate holder configured to rotate the substrate while holding the substrate with the back surface facing upward; a scrub cleaning tool configured to be rotatable; a two-fluid nozzle disposed above the substrate holder; and a housing defining a cleaning chamber in which the substrate holder, the scrub cleaning tool, and the two-fluid nozzle are located.

In an embodiment, the apparatus further comprises: an arm to which the scrub cleaning tool and the two-fluid nozzle are secured; and a pivot motor configured to rotate the arm, the scrub cleaning tool, and the two-fluid nozzle clockwise and counterclockwise through a predetermined angle around a predetermined pivot axis.

In an embodiment, a distance between the scrub cleaning tool and the predetermined pivot axis is equal to a distance between the two-fluid nozzle and the predetermined pivot axis.

In an embodiment, the substrate holder includes a plurality of rotatable holding rollers configured to hold a periphery of the substrate.

In an embodiment, the apparatus further comprises: a first substrate station configured to temporarily house the substrate whose back surface has been cleaned; and a second substrate station configured to temporarily house the substrate whose back surface has not yet been cleaned.

In an embodiment, each of the first substrate station and the second substrate station includes a container capable of forming a hermetic space therein, and a pure-water spray nozzle disposed in the container.

In an embodiment, there is provided a back surface cleaning apparatus comprising: a plurality of back-surface cleaning units each configured to clean a back surface of a substrate; a first substrate station configured to temporarily house the substrate whose back surface has been cleaned; a second substrate station configured to temporarily house the substrate whose back surface has not yet been cleaned; and a transfer robot configured to transport the substrate, whose back surface has not yet been cleaned, from the second substrate station to one of the plurality of back-surface cleaning units and to transport the substrate, whose back surface has been cleaned, from one of the plurality of back-surface cleaning units to the first substrate station, wherein each of the back-surface cleaning units comprises: a substrate holder configured to rotate the substrate while holding the substrate with the back surface facing upward; a scrub cleaning tool configured to be rotatable; a two-fluid nozzle disposed above the substrate holder; and a housing defining a cleaning chamber in which the substrate holder, the scrub cleaning tool, and the two-fluid nozzle are located.

In an embodiment, there is provided a substrate processing apparatus comprising: a back-surface polishing section configured to polish a back surface of a substrate; and the back surface cleaning apparatus according to claim 7 configured to clean the back surface of the substrate which has been polished by the back-surface polishing section.

In an embodiment, there is provided a method of cleaning a back surface of a substrate, comprising: receiving the substrate in a cleaning chamber and holding the substrate; rotating the substrate held in the cleaning chamber; rubbing a scrub cleaning tool against the back surface of the substrate in the cleaning chamber while rotating the scrub cleaning tool; and then delivering a two-fluid jet to the back surface of the substrate in the cleaning chamber.

In an embodiment, rubbing the scrub cleaning tool against the back surface of the substrate comprises rubbing the scrub cleaning tool against the back surface of the substrate while rotating the scrub cleaning tool and reciprocating the rotating scrub cleaning tool between a center and an edge portion of the substrate.

In an embodiment, delivering the two-fluid jet to the back surface of the substrate comprises delivering a two-fluid jet from a two-fluid nozzle to the back surface of the substrate while reciprocating the two-fluid nozzle between a center and an edge portion of the substrate.

In an embodiment, there is provided a method of cleaning a back surface of a substrate, comprising: receiving the substrate in a cleaning chamber and holding the substrate; rotating the substrate; delivering a two-fluid jet to the back surface of the substrate; and then rubbing a scrub cleaning tool against the back surface of the substrate while rotating the scrub cleaning tool.

According to the above-described embodiments, the first back-surface cleaning process, which is one of scrub cleaning and two-fluid cleaning, and the second back-surface cleaning process, which is the other one of scrub cleaning and two-fluid cleaning, are carried out successively. Since the back surface of the substrate is cleaned by the combination of scrub cleaning and two-fluid cleaning, particles, such as polishing debris, can be removed from the back surface of the substrate with high removal efficiency. Especially, because the first back-surface cleaning process and the second back-surface cleaning process are carried out successively in the same cleaning chamber with the substrate holder holding the substrate, high-removal efficiency cleaning of the back surface of a substrate can be performed in a short period of time. The substrate processing apparatus according to the above-described embodiments is provided with the back-surface cleaning section which can prevent polishing debris on a substrate after polishing of the back surface of the substrate from remaining on the back surface of the substrate after cleaning. The substrate processing apparatus can therefore prevent polishing debris from falling from a substrate onto another substrate in a substrate cassette.

DESCRIPTION OF EMBODIMENTS

Embodiments will now be described with reference to the drawings.

Figure 1:
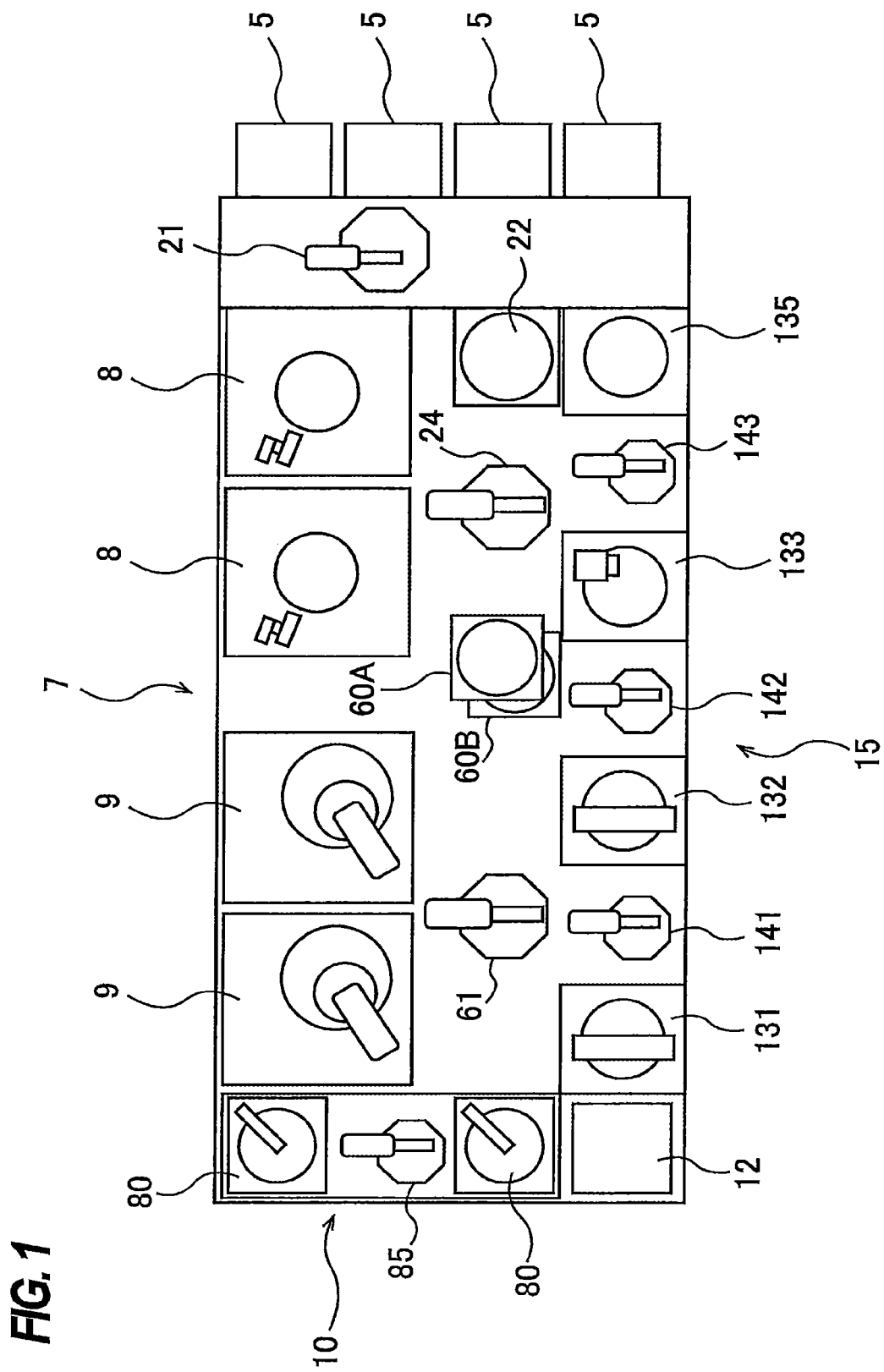
FIG. 1 is a schematic view of a substrate processing apparatus for polishing a back surface of a substrate such as a wafer, and cleaning the back surface.

FIG. 1 is a schematic view of a substrate processing apparatus for polishing the back surface of a substrate such as a wafer, and cleaning the back surface. A wafer is used as an exemplary substrate in the below-described embodiments. As shown in FIG. 1, the substrate processing apparatus includes a plurality of load ports 5 on which wafer cassettes (or substrate cassettes) with wafers housed therein are placed, a back-surface polishing section 7 for polishing a back surface of a wafer, a back-surface cleaning section 10 for cleaning the back surface of the wafer which has been polished in the back-surface polishing section 7, and a front-surface cleaning section 15 for cleaning and drying a front surface of the wafer. The substrate processing apparatus further includes an operation controller 12 for controlling operations of the back-surface polishing section 7, the back-surface cleaning section 10, the front-surface cleaning section 15, and below-described transfer robots.

A transfer robot 21 is disposed between the load ports 5 and the back-surface polishing section 7. The transfer robot 21 is operable to take a wafer from one of the wafer cassettes, and place the wafer on a temporary stage 22 disposed adjacent to the back-surface polishing section 7. A transfer robot 24 is disposed adjacent to the back-surface polishing section 7 and to the temporary stage 22.

The back-surface polishing section 7 includes two first back-surface polishing units 8 and two second back-surface polishing units 9. The two first back-surface polishing units 8 are disposed adjacent to the transfer robot 24. A wafer on the temporary stage 22 is transported by the transfer robot 24 to one of the two first back-surface polishing units 8.

Polishing of a back surface of a wafer comprises a first polishing process and a second polishing process. The first polishing process is a process of polishing an outer circumferential region of the back surface of the wafer, and the second polishing process is a process of polishing a center-side region of the back surface of the wafer. The center-side region is an area including the center of the wafer, while the outer circumferential region is an area located radially outwardly of the center-side region. The center-side region and the outer circumferential region are adjacent to each other, and the combination of the center-side region and the outer circumferential region covers the entirety of the back surface of the wafer.

Figure 2A:
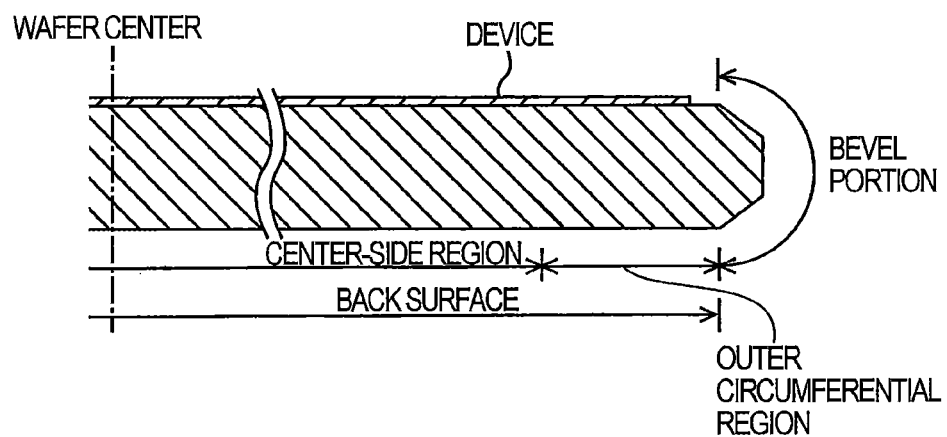
FIGS. 2A and 2B are cross-sectional views each showing a wafer.
Figure 2B:
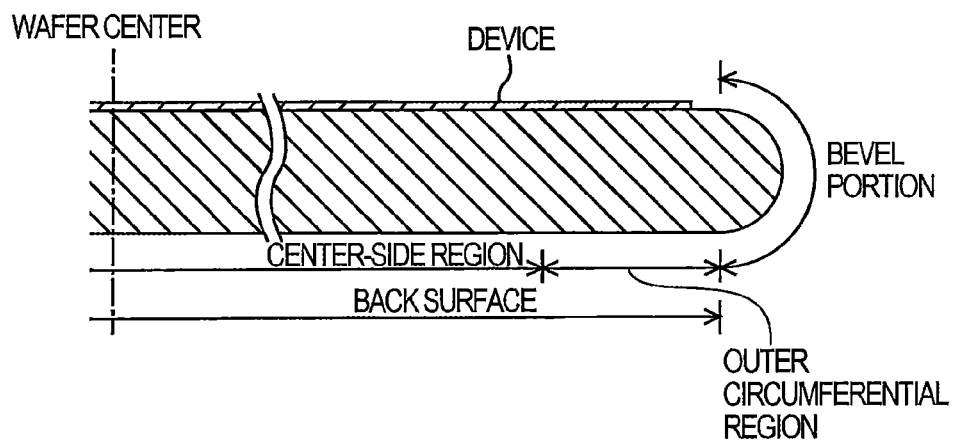

FIG. 2A and FIG. 2B are enlarged cross sectional views each showing a peripheral portion of a wafer. More specifically, FIG. 2A is a cross-sectional view of a so-called straight type wafer, and FIG. 2B is a cross-sectional view of a so-called round type wafer. In this specification, a front surface of a wafer (or a substrate) refers to a surface with devices and interconnects (or circuits) formed thereon, and a back surface of a water (or a substrate) refers to a flat surface at the opposite side of the wafer from the surface on which devices and interconnects (or circuits) are formed. The outermost circumferential surface of the wafer is called a bevel portion. The back surface of the wafer is the flat surface which is located radially inwardly of the bevel portion. The outer circumferential region of the back surface of the wafer adjoins the bevel portion. In an example, the outer circumferential region is an annular region having a width of ten-odd millimeters, and the center-side region is a circular region lying inside the outer circumferential region.

Figure 3:
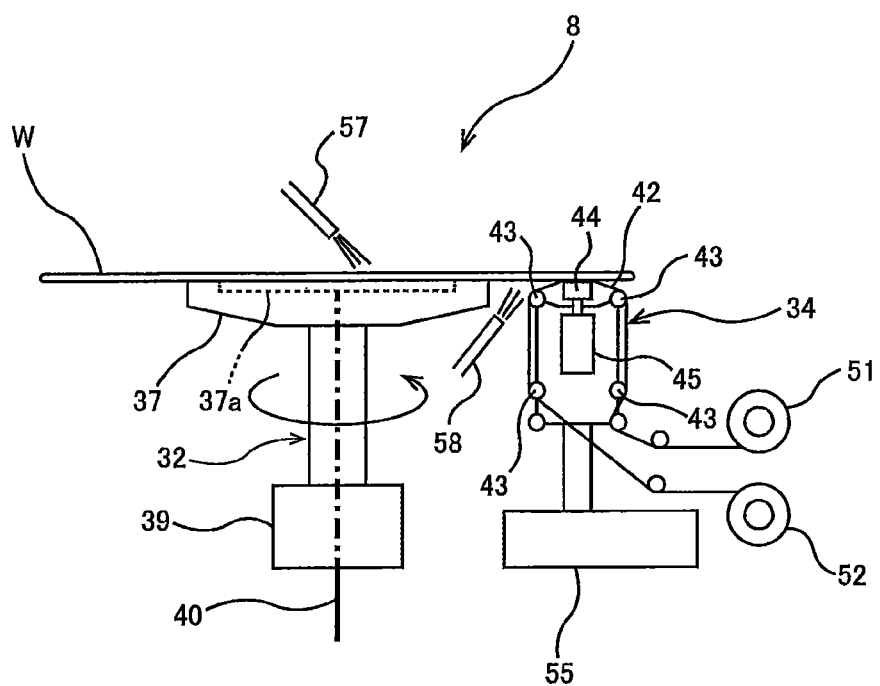
FIG. 3 is a schematic view of a first back-surface polishing unit for polishing a outer circumferential region of a back surface of a wafer.

FIG. 3 is a schematic view showing a first back-surface polishing unit 8 for polishing the outer circumferential region of the back surface of the wafer. This first back-surface polishing unit 8 has a first substrate holder 32 for holding and rotating the wafer (i.e., substrate) W, and a first polishing head 34 for pressing a polishing tool against the back surface of the wafer W when held by the first substrate holder 32. The first substrate holder 32 has a substrate stage 37 configured to hold the wafer W by vacuum suction, and a stage motor 39 configured to rotate the substrate stage 37.

The wafer W is placed on the substrate stage 37 with the back surface of the wafer W facing downward. A groove 37a is formed on a top surface of the substrate stage 37, and this groove 37a communicates with a vacuum line 40. The vacuum line 40 is coupled to a vacuum source (e.g., a vacuum pump) which is not shown in the figures. When a vacuum is created in the groove 37a of the substrate stage 37 through the vacuum line 40, the wafer W is held on the substrate stage 37 by a vacuum suction force. In this state, the stage motor 39 rotates the substrate stage 37 to thereby rotate the wafer W about its axis. A diameter of the substrate stage 37 is smaller than a diameter of the wafer W, and the center-side region of the back surface of the wafer W is held by the substrate stage 37. The outer circumferential region of the back surface of the wafer W protrudes outwardly from the substrate stage 37.

The first polishing head 34 is arranged adjacent to the substrate stage 37. More specifically, the first polishing head 34 is located so as to face the exposed outer circumferential region of the back surface of the wafer W. The first polishing head 34 has a plurality of rollers 43 which support a polishing tape 42 serving as the polishing tool, a pressing member 44 for pressing the polishing tape 42 against the back surface of the wafer W, and a pneumatic cylinder 45 as an actuator for applying a pressing force to the pressing member 44. The pneumatic cylinder 45 applies the pressing force to the pressing member 44, which in turn presses the polishing tape 42 against the back surface of the wafer W. Instead of the polishing tape, a grindstone may be used as the polishing tool.

One end of the polishing tape 42 is connected to a feeding reel 51, and the other end is connected to a take-up reel 52. The polishing tape 42 is advanced at a predetermined speed from the feeding reel 51 to the take-up reel 52 via the first polishing head 34. Examples of the polishing tape 42 to be used include a tape having abrasive grains fixed to a surface thereof, and a tape constituted by a hard nonwoven fabric. The first polishing head 34 is coupled to a polishing-head moving mechanism 55. This polishing-head moving mechanism 55 is configured to move the first polishing head 34 outwardly in the radial direction of the wafer W. The polishing-head moving mechanism 55 may be constructed by a combination of a ball screw and a servomotor.

Liquid supply nozzles 57, 58 for supplying a polishing liquid onto the wafer W are arranged above and below the wafer W which is held by the substrate stage 37. Pure water may preferably be used as the polishing liquid. This is for the reason that use of a polishing liquid containing a chemical component having an etching action may enlarge a recess formed on the back surface of the wafer W.

Figure 4:
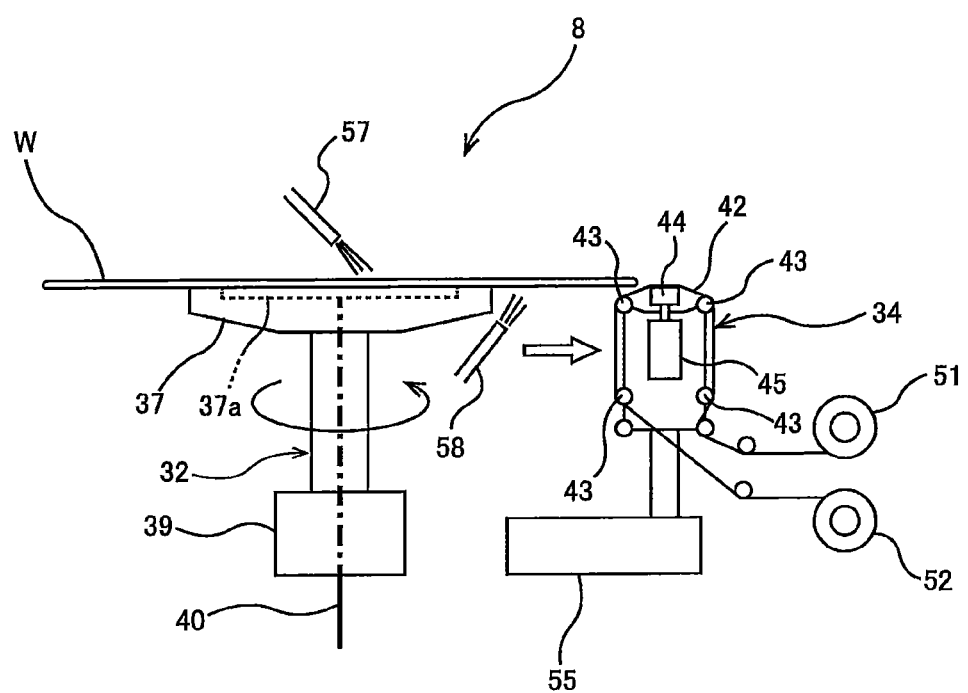
FIG. 4 is a diagram illustrating a movement of a first polishing head shown in FIG. 3.

The outer circumferential region of the back surface of the wafer W is polished as follows. The wafer W, which is held on the substrate stage 37, is rotated about its axis by the stage motor 39, and the polishing liquid is supplied from the liquid supply nozzles 57, 58 to a front surface and the back surface of the rotating wafer W. In this state, the first polishing head 34 presses the polishing tape 42 against the back surface of the wafer W. The polishing tape 42 is placed in sliding contact with the outer circumferential region of the back surface of the wafer W to thereby polish the outer circumferential region. The polishing-head moving mechanism 55 moves the first polishing head 34 outwardly in the radial direction of the wafer W at a predetermined speed as indicated by arrow shown in FIG. 4, while the first polishing head 34 is pressing the polishing tape 42 against the back surface of the wafer W. In this manner, the entirety of the outer circumferential region is polished by the polishing tape 42. During polishing, the polishing liquid flows from the inside to the outside of the wafer W to thereby remove polishing debris from the wafer W.

As shown in FIG. 1, temporary stages 60A, 60B are disposed between the first back-surface polishing unit 8 and the second back-surface polishing unit 9. The temporary stage 60A is located above the temporary stage 60B. The upper temporary stage 60A is used for allowing a cleaned wafer to be placed temporarily thereon, while the lower temporary stage 60B is used for allowing a non-cleaned wafer to be placed temporarily thereon. The wafer that has been polished by the first back-surface polishing unit 8 is placed on the lower temporary stage 60B by the transfer robot 24.

A transfer robot 61 is disposed adjacent to the temporary stages 60A, 60B and the two second back-surface polishing units 9. This transfer robot 61 has a function to overturn a wafer. The transfer robot 61 is configured to remove a wafer from the lower temporary stage 60B, overturn the wafer so that its back surface faces upward, and transports the wafer to one of the two second back-surface polishing units 9.

Figure 5:
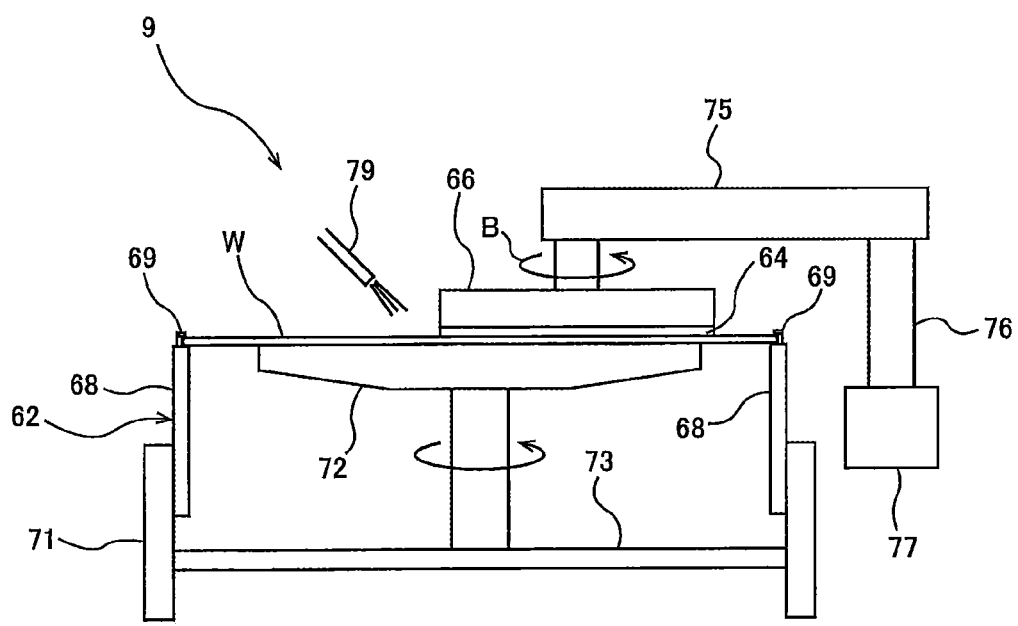
FIG. 5 is a schematic view of a second back-surface polishing unit for polishing a center-side region of a back surface of a wafer.
Figure 6:
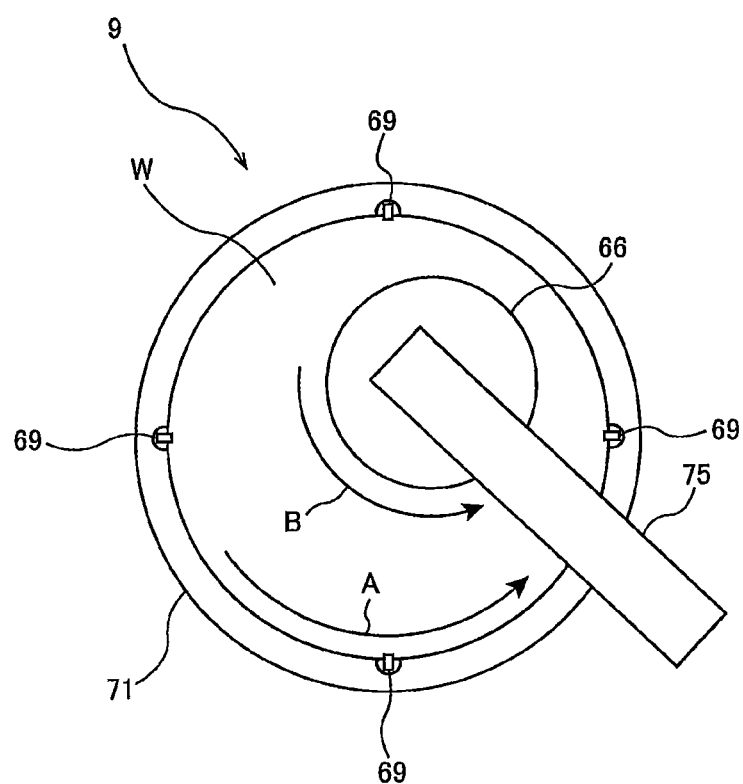
FIG. 6 is a plan view of the second back-surface polishing unit.

FIG. 5 is a schematic view showing the second back-surface polishing unit 9 for polishing the center-side region of the back surface of the wafer W, and FIG. 6 is a plan view of the second back-surface polishing unit 9. The second back-surface polishing unit 9 has a second substrate holder 62 configured to hold and rotate the wafer W, and a second polishing head 66 configured to press a polishing tool 64 against the back surface of the wafer W. The second substrate holder 62 has a plurality of chucks 68 for holding a bevel portion of the wafer W, and further has a hollow motor 71 for rotating these chucks 68 around the axis of the wafer W. Each chuck 68 has a clamp 69 at its upper end, and the bevel portion of the wafer W is gripped by this clamp 69. With the clamps 69 gripping the bevel portion of the wafer W, the hollow motor 71 rotates the chucks 68 to thereby rotate the wafer W about its axis as indicated by arrow A shown in FIG. 6.

In the second back-surface polishing unit 9, the wafer W is held by the second substrate holder 62 with the back surface of the wafer W facing upward. The lower surface (i.e., the surface at the opposite side from the back surface) of the wafer W, which is held by the chucks 68, is supported by a substrate supporting member 72. This substrate supporting member 72 is coupled to the hollow motor 71 through a connection member 73 so that the substrate supporting member 72 is rotated together with the second substrate holder 62 by the hollow motor 71. The substrate supporting member 72 has a circular upper surface which contacts the lower surface of the wafer W. This upper surface of the substrate supporting member 72 is constituted by a sheet which is made of an elastic material, such as a nonwoven fabric or a backing film, so as not to cause damage to devices fabricated on the wafer W. The substrate supporting member 72 merely supports the lower surface of the wafer W and does not hold the wafer W by the vacuum suction or the like. The wafer W and the substrate supporting member 72 are rotated in synchronization with each other, and a relative speed between the wafer W and the substrate supporting member 72 is zero.

The second polishing head 66 is arranged above the wafer W and is configured to press the polishing tool 64 downwardly against the back surface of the wafer W. Examples of the polishing tool 64 to be used include a nonwoven fabric having abrasive grains fixed to a surface thereof, a hard nonwoven fabric, a grindstone, and the polishing tape which is used in the aforementioned first back-surface polishing unit 8. For example, the polishing tool 64 may be a plurality of polishing tapes which are arranged around an axis of the second polishing head 66.

The second polishing head 66 is supported by a head arm 75. A rotating mechanism, which is not shown in the figures, is provided in this head arm 75 so that the second polishing head 66 is rotated about its axis by the rotating mechanism as indicated by arrow B. An end of the head arm 75 is fixed to a pivot shaft 76. This pivot shaft 76 is coupled to an actuator 77, such as an electric motor. This actuator 77 rotates the pivot shaft 76 through a predetermined angle to thereby move the second polishing head 66 between a polishing position which is above the wafer W and a standby position which is outside of the wafer W.

A liquid supply nozzle 79 for supplying a polishing liquid to the back surface of the wafer W is disposed adjacent to the second polishing head 66. Pure water may preferably be used as the polishing liquid.

The center-side region of the wafer W is polished as follows. With the back surface of the wafer W facing upward, the bevel portion of the wafer W is held by the chucks 68. The wafer W is rotated around the axis thereof by the hollow motor 71, and the polishing liquid is supplied from the liquid supply nozzle 79 onto the back surface of the rotating wafer W. In this state, the second polishing head 66 presses the polishing tool 64 against the center-side region which includes the center of the back surface of the wafer W, while rotating the polishing tool 64. The polishing tool 64 is placed in sliding contact with the center-side region of the back surface of the wafer W to thereby polish the center-side region. During polishing, the second polishing head 66 may oscillate in the radial direction of the wafer W while keeping the polishing tool 64 in contact with the center of the wafer W. In this manner, the center-side region of the back surface of the wafer W is polished by the polishing tool 64. During polishing, the polishing liquid flows from the inside to the outside of the wafer W to thereby remove polishing debris from the wafer W.

In the above-discussed embodiment, the outer circumferential region of the back surface of the wafer W is firstly polished, and subsequently the center-side region of the back surface is polished. In one embodiment, the center-side region of the back surface may be firstly polished, and then the outer circumferential region of the back surface may be polished.

As shown in FIG. 1, the back-surface cleaning section 10 is disposed adjacent to the back-surface polishing section 7. A wafer, whose back surface has been polished by the first back-surface polishing unit 8 and the second back-surface polishing unit 9, is transported by the transfer robot 61 to the back-surface cleaning section 10.

Figure 7:
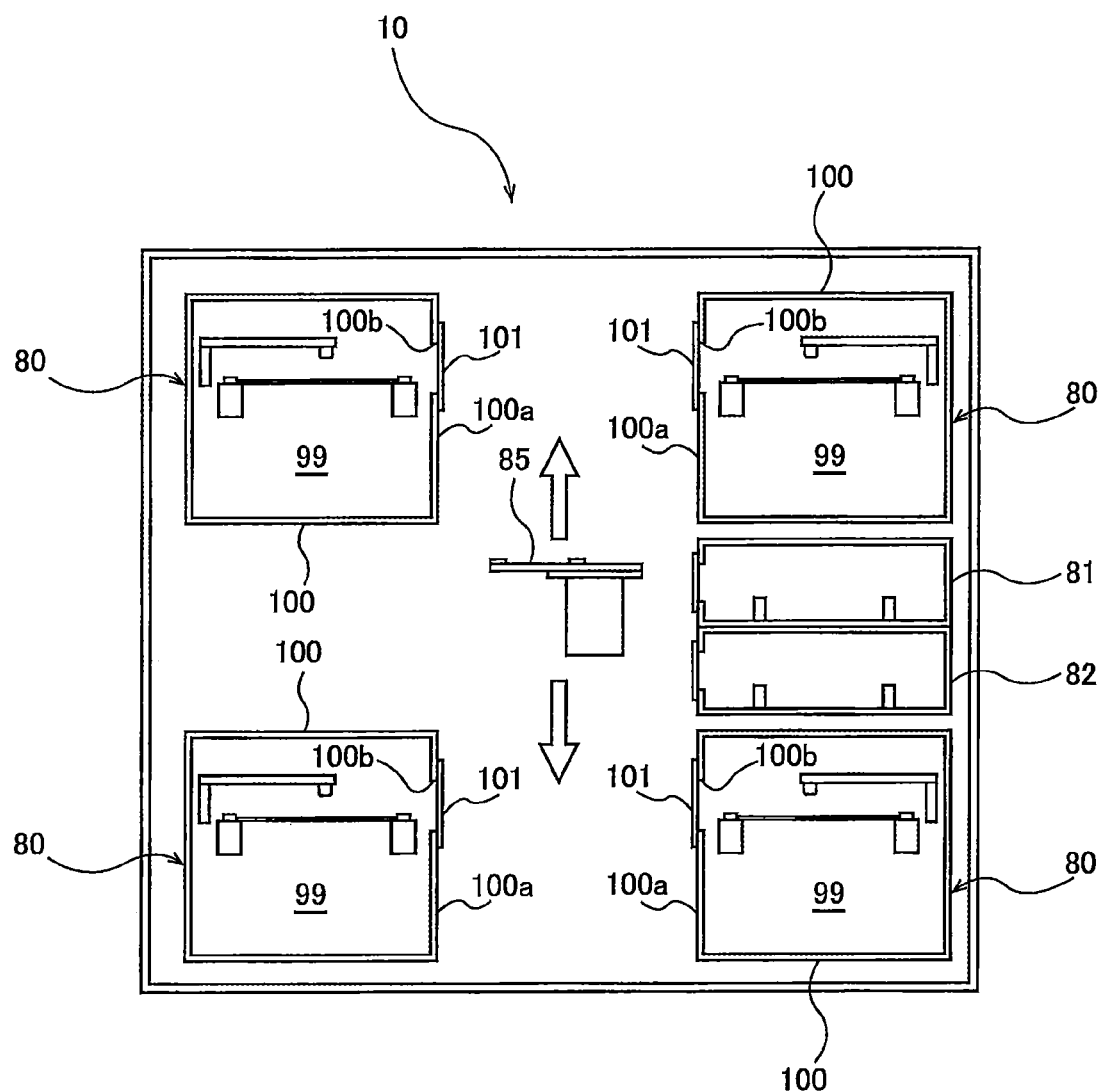
FIG. 7 is a schematic overall view of a back-surface cleaning section.

FIG. 7 is a schematic overall view of the back-surface cleaning section 10. The back-surface cleaning section 10 is an apparatus for cleaning the back surface of the wafer after the back surface is polished. As shown in FIG. 7, the back-surface cleaning section 10 includes a plurality of (four in this embodiment) back-surface cleaning units 80, a first wafer station (or a first substrate station) 81 for temporarily housing a wafer whose back surface has been cleaned by one of the back-surface cleaning units 80, a second wafer station (or a second substrate station) 82 for temporarily housing a wafer whose back surface has not yet been cleaned, and a transfer robot 85 capable of transporting a wafer between the first and second wafer stations 81, 82 and each back-surface cleaning unit 80. The operations of the back-surface cleaning units 80 and the transfer robot 85 are controlled by the operation controller 12 shown in FIG. 1.

A wafer, whose back surface has been polished but has not yet been cleaned, is transported into the second wafer station 82 by the transfer robot 61 (see FIG. 1), with the back surface of the wafer facing upward. A wafer, whose back surface has been polished and cleaned, is transported into the first wafer station 81 by the transfer robot 85 of the back-surface cleaning section 10, with the back surface of the wafer facing upward. Although in this embodiment the first wafer station 81 is disposed above the second wafer station 82, the first wafer station 81 may be disposed below the second wafer station 82.

In this embodiment two back-surface cleaning units 80 are arranged along a vertical direction, and other two back-surface cleaning units 80 are arranged along a vertical direction. However, the back-surface cleaning units 80 may be arranged differently. For example, the four back-surface cleaning units 80 may be arranged along a vertical or horizontal direction.

The transfer robot 85 is arranged in a position accessible to the four back-surface cleaning units 80. The first and second wafer stations 81, 82 are disposed between the two vertically-arranged back-surface cleaning units 80. The first wafer station 81 and the second wafer station 82 have the same construction; therefore, the first wafer station 81 will be described below.

Figure 8:
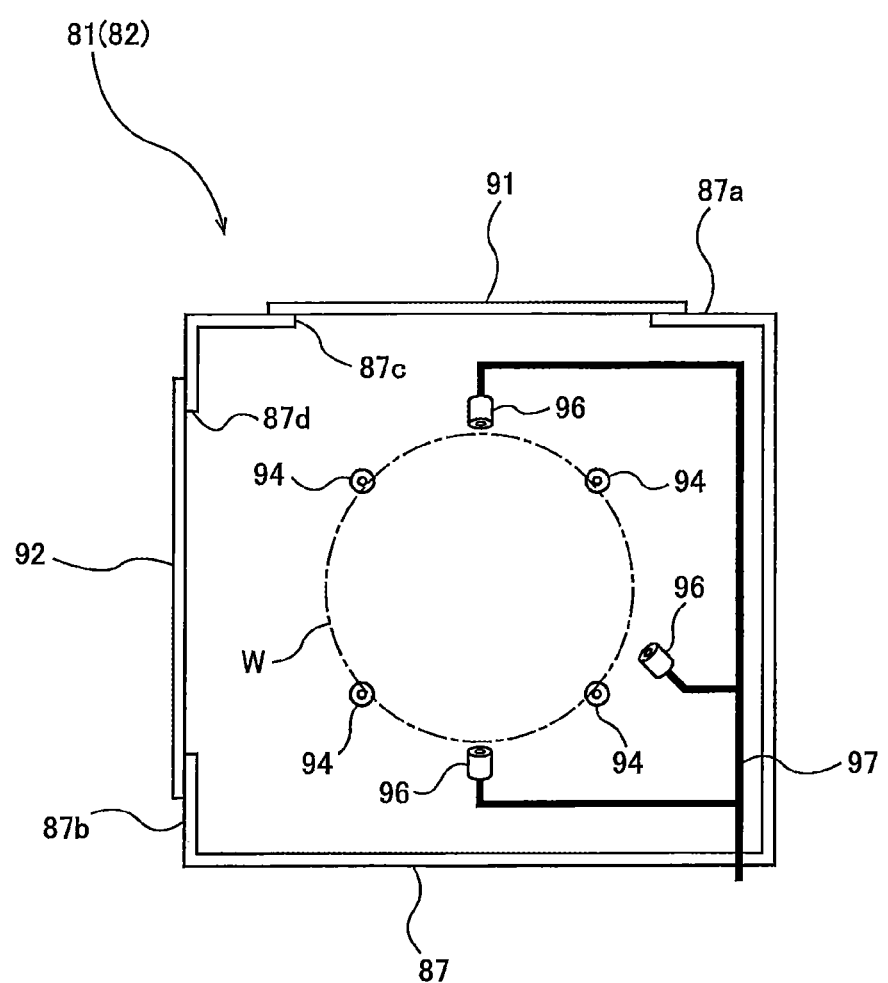
FIG. 8 is a horizontal cross-sectional view of a first wafer station.

FIG. 8 is a horizontal cross-sectional view of the first wafer station 81. As shown in FIG. 8, the first wafer station 81 includes a box-shaped container 87 which can house a wafer W therein, a first shutter 91 mounted to a first wall 87a constituting the container 87, a second shutter 92 mounted to a second wall 87b constituting the container 87, and a plurality of support posts 94 on which the wafer W is to be placed. In this embodiment four support posts 94 are disposed in the container 87, while five or more support posts may be disposed.

A first opening 87c is formed in the first wall 87a so that the wafer W can pass through the first opening 87c, which is covered with the first shutter 91. Similarly, a second opening 87d is formed in the second wall 87b so that the wafer W can pass through the second opening 87d, which is covered with the second shutter 92. The first shutter 91 and the second shutter 92 are usually closed.

When the first shutter 91 and the second shutter 92 are closed, a hermetic space is formed in the container 87. This is to prevent drying of the wafer W. In order to keep the wafer W in a wet state in the container 87, a plurality of pure-water spray nozzles 96 are disposed in the container 87. The pure-water spray nozzles 96 are coupled to a pure-water supply pipe 97. In this embodiment three pure-water spray nozzles 96 are disposed, each nozzle facing the lower surface (opposite to the back surface) of the wafer W. In one embodiment, one or two pure-water spray nozzles may be disposed, or four or more pure-water spray nozzles may be disposed.

The second shutter 92 is opened when the transfer robot 85 (see FIG. 7) transports a wafer, which has been cleaned by one of the back-surface cleaning units 80, into the first wafer station 81. The first shutter 91 is opened when the transfer robot 61 (see FIG. 1) removes the cleaned wafer from the first wafer station 81. On the other hand, the first shutter 91 of the second wafer station 82 is opened when the transfer robot 61 (see FIG. 1) transports a wafer, to be cleaned, into the second wafer station 82. The second shutter 92 of the second wafer station 82 is opened when the transfer robot 85 (see FIG. 7) removes the wafer, to be cleaned, from the second wafer station 82.

As shown in FIG. 7, the transfer robot 85 of the back-surface cleaning section 10 is configured to be movable in a vertical direction. The transfer robot 85 transports a wafer, with its back surface facing upward, to one of the four back-surface cleaning units 80. The four back-surface cleaning units 80 have the same construction. Each back-surface cleaning unit 80 includes a housing 100 which defines a cleaning chamber 99 therein. An opening 100b, through which a wafer can pass, is formed in a side wall 100a of the housing 100. The side wall 100a is provided with a shutter 101 that covers the opening 100b. The shutter 101 is opened when a wafer is transported into the cleaning chamber 99 of the back-surface cleaning unit 80 and when the wafer is transported out of the cleaning chamber 99 of the back-surface cleaning unit 80.

Figure 9:
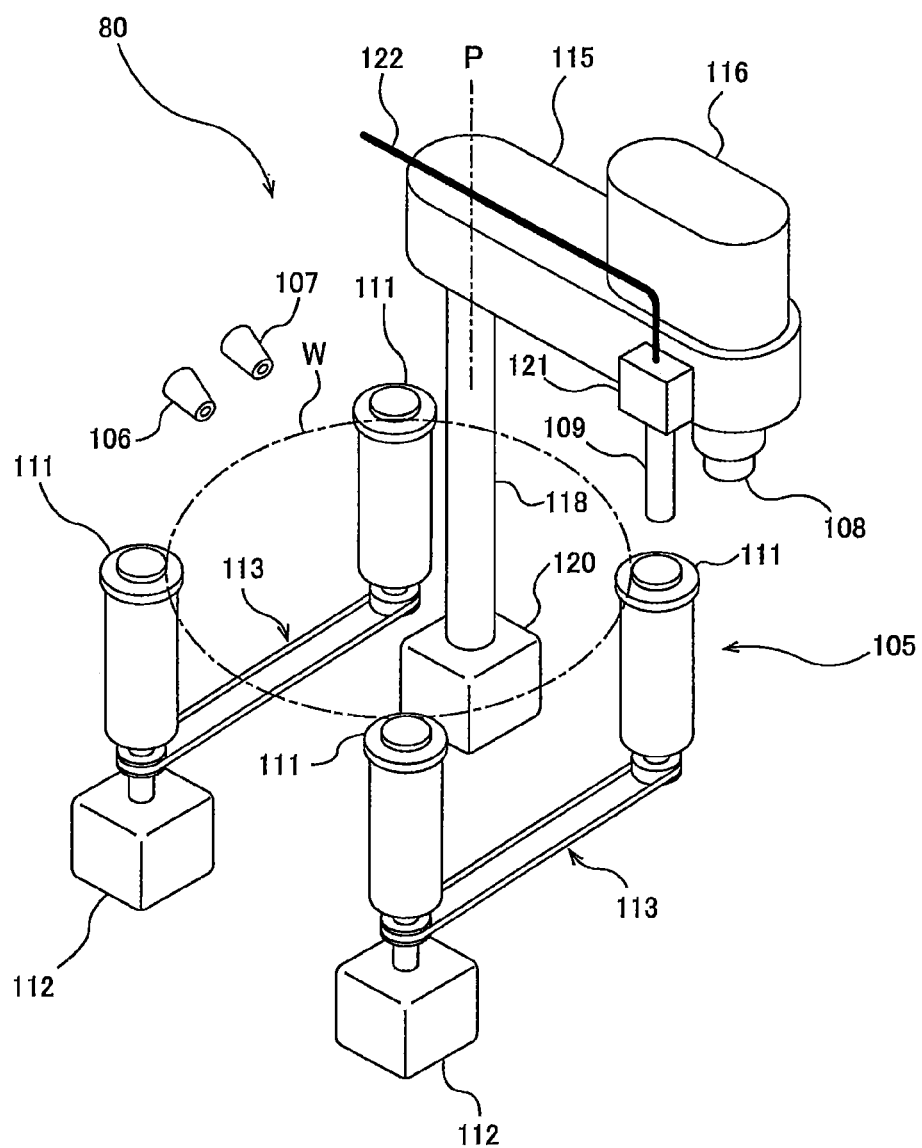
FIG. 9 is a perspective view showing details of a back-surface cleaning unit.

FIG. 9 is a perspective view showing details of the back-surface cleaning unit 80. The depiction of the housing 100 and the shutter 101 has been omitted from FIG. 9. The back-surface cleaning unit 80 includes a wafer holder (or a substrate holder) 105 for holding a wafer W and rotating the wafer W about its axis, a chemical supply nozzle 107 for supplying a liquid chemical to the back surface (upper surface) of the wafer W held by the wafer holder 105, a rinsing-liquid supply nozzle 106 for supplying pure water as a rinsing liquid to the back surface of the wafer W, a pen-type cleaning tool 108 as a scrub cleaning tool which, while rotating about its axis, can contact the back surface of the wafer W, and a two-fluid nozzle 109 for supplying a two-fluid jet to the back surface of the wafer W. The pen-type cleaning tool 108 is formed of a porous material, such as a sponge. The pen-type cleaning tool 108 formed of a sponge is called pen sponge.

The wafer holder (or the substrate holder) 105 includes a plurality of holding rollers 111 for holding the periphery of the wafer W, and roller motors 112 for rotating these holding rollers 111. Four holding rollers 111 are provided in this embodiment. The wafer W, to be cleaned, is placed, with its back surface facing upward, on the holding rollers 111 by the transfer robot 85, and is rotated by the holding rollers 111. The below-described cleaning of the back surface of the wafer W is performed with the back surface of the wafer W facing upward.

Two of the four holding rollers 111 are coupled by a torque transmission mechanism 113, and the other two are likewise coupled by another torque transmission mechanism 113. The torque transmission mechanism 113 is, for example, comprised of a combination of pulleys and a belt. Two roller motors 112 are provided in this embodiment. One of the two roller motors 112 is coupled to two holding rollers 111 that are coupled by the torque transmission mechanism 113, while the other roller motor 112 is coupled to the other two holding rollers 111 that are coupled by the other torque transmission mechanism 113.

The wafer holder (substrate holder) 105 may have a construction different from that of this embodiment. For example, in one embodiment, one roller motor may be coupled to all the holding rollers 111 by a torque transmission mechanism(s). While in this embodiment all the holding rollers 111 are coupled to the roller motors 112, some of the plurality of holding rollers 111 may be coupled to the roller motor(s) 112. Preferably, at least two of the plurality of holding rollers 111 are coupled to the roller motor(s) 112.

In this embodiment two of the four holding rollers 111 are movable in directions closer to and away from the other two holding rollers 111 by means of a not-shown moving mechanism. After the wafer W is placed on the upper ends of the four holding rollers 111 by the transfer robot 85, two holding rollers 111 move toward the other two holding rollers 111 until the four holding rollers 111 come to hold the periphery of the wafer W. After cleaning of the back surface of the wafer W, the two holding rollers 111 move away from the other two holding rollers 111, whereby the four holding rollers 111 release the periphery of the wafer W. In one embodiment, all the holding rollers 111 may be configured to be movable by means of a not-shown moving mechanism. Since the holding rollers 111 do not hold the entire periphery of the wafer W, the pen-type cleaning tool 108 can clean the entire back surface, including an edge portion (an outermost peripheral portion of the back surface), of the wafer W.

The back-surface cleaning unit 80 further includes an arm 115 to which the pen-type cleaning tool 108 and the two-fluid nozzle 109 are secured, an actuator 116 coupled to the pen-type cleaning tool 108, a support shaft 118 that supports the arm 115, and a pivot motor 120 coupled to the support shaft 118. The arm 115, the pen-type cleaning tool 108 and the two-fluid nozzle 109 are disposed at positions higher than the holding rollers 111. The actuator 116 is configured to be capable of rotating the pen-type cleaning tool 108 (e.g. a pen sponge) about its axis, and also capable of moving the rotating pen-type cleaning tool 108 in its axial direction. Thus, the actuator 116 is configured to be capable of pressing the pen-type cleaning tool 108 against the back surface of the wafer W, held by the holding rollers 111, while rotating the pen-type cleaning tool 108 about its axis. The axis of the pen-type cleaning tool 108 is perpendicular to the back surface of the wafer W held by the holding rollers 111. In this embodiment the axis of the pen-type cleaning tool 108 extends in the vertical direction, and the wafer W is held horizontally by the holding rollers 111.

The two-fluid nozzle 109 is adjacent to the pen-type cleaning tool 108. More specifically, the two-fluid nozzle 109 extends downwardly from a nozzle holder 121, which is secured to the side surface of the arm 115. The two-fluid nozzle 109 is coupled to a two-fluid supply line 122 through the nozzle holder 121. The pen-type cleaning tool 108 is located below the distal end of the arm 115. The pivot motor 120 is configured to be capable of rotating the support shaft 118 clockwise and counterclockwise through a predetermined angle. As the support shaft 118 is rotated by means of the pivot motor 120, the arm 115, the pen-type cleaning tool 108 and the two-fluid nozzle 109 pivot clockwise and counterclockwise through a predetermined angle around the pivot axis P of the support shaft 118.

Figure 10:
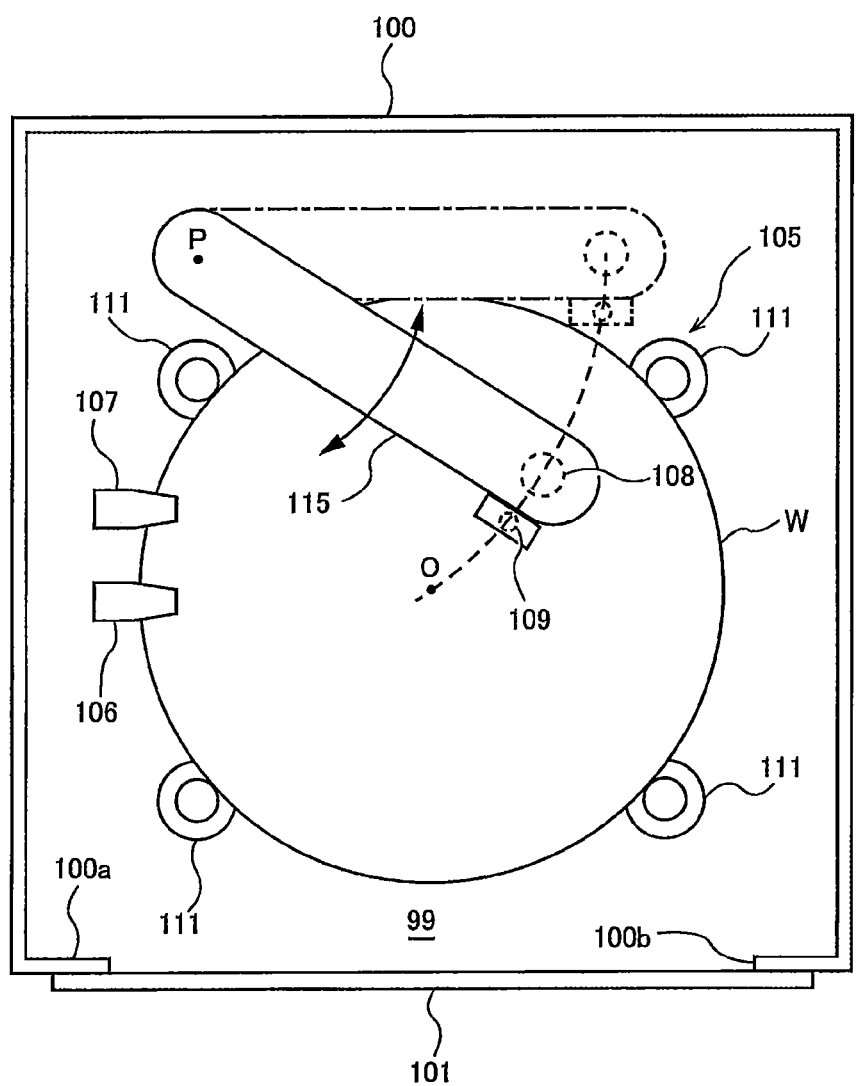
FIG. 10 is a top view of an arm, a pen-type cleaning tool, and a two-fluid nozzle.

FIG. 10 is a plan view of the arm 115, the pen-type cleaning tool 108 and the two-fluid nozzle 109. As shown in FIG. 10, the holding rollers 111, the arm 115, the pen-type cleaning tool 108 and the two-fluid nozzle 109 are disposed in the cleaning chamber 99 formed by the housing 100. The wafer W, with its back surface facing upward, is transported into the cleaning chamber 99 and placed on the holding rollers 111 by the transfer robot 85. The holding rollers 111 hold the periphery of the wafer W and rotate the wafer W. Cleaning of the back surface of the wafer W is performed while the wafer W is rotating.

Along with the pivoting movement of the arm 115, the pen-type cleaning tool 108 and the two-fluid nozzle 109 move together in an arc path passing through the center O of the wafer W held by the holding rollers 111. A distance between the pen-type cleaning tool 108 and the pivot axis P of the support shaft 118 is equal to a distance between the two-fluid nozzle 109 and the pivot axis P of the support shaft 118. Accordingly, the pen-type cleaning tool 108 and the two-fluid nozzle 109 move in the same path along with the pivoting movement of the arm 115. More specifically, during cleaning of the back surface of the wafer W, the pen-type cleaning tool 108 and the two-fluid nozzle 109 reciprocate between the center O of the wafer W and an edge portion (an outermost peripheral portion of the back surface) of the wafer W. The wafer holder (substrate holder) 105 is not limited to the holding roller type: For example, the wafer holder 105 may be configured to be capable of attracting and horizontally holding a central portion of the front surface of the wafer W with its back surface facing upward, and capable of rotating the wafer W.

The back-surface cleaning unit 80 according to this embodiment can perform scrub cleaning with the pen-type cleaning tool 108 and two-fluid cleaning with the two-fluid nozzle 109 successively in the same cleaning chamber 99 while rotating the wafer W by means of the holding rollers 111 of the wafer holder (substrate holder) 105. The scrub cleaning and the two-fluid cleaning are both performed while holding the wafer W with its back surface facing upward. By performing the physical scrub cleaning and the two-fluid cleaning successively, it becomes possible to perform cleaning of the wafer W while making the best use of the characteristics of the respective cleaning processes.

The scrub cleaning is performed in the following manner. While the wafer W is being rotated about its own axis by means of the holding rollers 111 of the wafer holder (substrate holder) 105, a liquid chemical is supplied from the chemical supply nozzle 107 to the back surface of the wafer W and the pen-type cleaning tool 108 (i.e. scrub cleaning tool) is rubbed against the back surface of the wafer W in the presence of the liquid chemical on the back surface of the wafer W. During the scrub cleaning, the pen-type cleaning tool 108, while it is being rotated by the actuator 116, is pressed against the back surface of the wafer W. Further, during the scrub cleaning, the pen-type cleaning tool 108, while it is kept pressed against the back surface of the wafer W, reciprocates between the center O of the rotating wafer W and an edge portion (an outermost peripheral portion of the back surface) of the wafer W a predetermined number of times. The two-fluid nozzle 109 does not supply the two-fluid jet onto the back surface of the wafer W during the scrub cleaning. After the scrub cleaning is terminated, the pen-type cleaning tool 108 is moved away from the back surface of the wafer W so as to prevent dropping of the liquid chemical from the pen-type cleaning tool 108 onto the wafer W. In order to prevent the dropping of the liquid chemical, a cover member (not shown) which can be located under the pen-type cleaning tool 108 in a retreat position may be provided e.g. on the arm 115.

The two-fluid cleaning is performed in the following manner. While the wafer W is being rotated about its own axis by means of the holding rollers 111 of the wafer holder (substrate holder) 105, the two-fluid jet is delivered from the two-fluid nozzle 109 to the back surface of the wafer W. The two-fluid jet is a mixture of a liquid (e.g. carbonated water) and a gas (e.g. nitrogen gas). During the two-fluid cleaning, the two-fluid nozzle 109 reciprocates between the center O of the rotating wafer W and an edge portion (an outermost peripheral portion of the back surface) of the wafer W a predetermined number of times. During the two-fluid cleaning, the pen-type cleaning tool 108 does not contact the back surface of the wafer W, and the liquid chemical is not supplied to the back surface of the wafer W.

In order to prevent the two-fluid jet, which has been delivered to the wafer W, from scattering and reaching the front surface of the wafer W, a rotating cup (not shown) may be provided around the holding rollers 111. The rotating cup may be configured to rotate at the same rotational speed and in the same direction as the rotating wafer W. This makes the relative speed between the wafer W and the rotating cup zero, and can therefore prevent acceleration of liquid droplets hitting the rotating cup, thereby preventing scattering of the liquid droplets.

In one embodiment, the back-surface cleaning unit 80 performs a first back-surface cleaning process of scrub-cleaning the back surface of the wafer W with the pen-type cleaning tool 108, and then performs a second back-surface cleaning process of cleaning the back surface of the wafer W with the two-fluid jet. After the cleaning of the wafer W with the two-fluid jet, a rinsing liquid (typically pure water) may be supplied from the rinsing-liquid supply nozzle 106 to the back surface of the wafer W. In one embodiment, the back-surface cleaning unit 80 may perform a first back-surface cleaning process of cleaning the back surface of the wafer W with the two-fluid jet, and then perform a second back-surface cleaning process of scrub-cleaning the back surface of the wafer W with the pen-type cleaning tool 108. In this case, after the scrub cleaning, a rinsing liquid is supplied from the rinsing-liquid supply nozzle 106 to the back surface of the wafer W to rinse the liquid chemical off the back surface of the wafer W.

Further, in one embodiment, after rinsing of the wafer W, the wafer W may be spin-dried by rotating the wafer W for a predetermined period of time to force liquid droplets off the wafer W by centrifugal force. In one embodiment, after first rinsing the back surface of the cleaned wafer W, a liquid that has reached the front surface of the wafer W may be rinsed off, for example, by supplying a rinsing liquid to the back surface of the wafer W over an area ranging from the center to the periphery of the back surface while pivoting the rinsing-liquid supply nozzle 106, then supplying the rinsing liquid to at least a bevel portion or an edge portion of the front surface of the wafer W, and subsequently spin-drying the wafer W by rotating it for a predetermined time to force liquid droplets off the wafer W by centrifugal force.

According to the above-described embodiments, the first back-surface cleaning process, which is one of the scrub cleaning and the two-fluid cleaning, and the second back-surface cleaning process, which is the other one of the scrub cleaning and the two-fluid cleaning, are carried out successively. Since the back surface of the wafer W is cleaned by the combination of the scrub cleaning and the two-fluid cleaning, particles, such as polishing debris, can be removed from the back surface of the wafer W with high removal efficiency. In the case of performing the scrub cleaning of the back surface of the wafer W using a liquid chemical, the chemical can be selected depending on the condition of the back surface of the wafer W. High-removal efficient cleaning of the back surface of the wafer W can be performed in a short period of time because the first back-surface cleaning process and the second back-surface cleaning process are carried out successively in the same cleaning chamber 99 while the wafer W is held by the wafer holder (substrate holder) 105.

The operations of the first back-surface cleaning process and the second back-surface cleaning process are controlled by the operation controller 12 shown in FIG. 1. The back-surface cleaning unit 80 may further include a surface monitoring device for monitoring the condition of the back surface of a wafer W. The surface monitoring device may be a known device, such as a device which irradiates the wafer surface with infrared light to measure the number of particles on the wafer surface, or a device which produces an image of the wafer surface and determines the condition of the wafer surface based on the image. The surface monitoring device may send data showing the condition of the back surface of the wafer W to the operation controller 12, and the operation controller 12 may control the operations of the first back-surface cleaning process and the second back-surface cleaning process based on the data. For example, the operation controller 12 may determine the timing of switching from the first back-surface cleaning process to the second back-surface cleaning process or determine times for the first back-surface cleaning process and the second back-surface cleaning process based on the data sent from the surface monitoring device.

The wafer W, whose back surface has been cleaned by the back-surface cleaning unit 80, is removed from the back-surface cleaning unit 80 and transported into the first wafer station 91 by the transfer robot 85.

Referring back to FIG. 1, the wafer, whose back surface has been cleaned, is removed from the first wafer station 91 of the back-surface cleaning section 10, overturned so that the back surface faces downward, and then transported to the upper temporary stage 60A by the transfer robot 61. The wafer is then cleaned in the front-surface cleaning section 15. The front-surface cleaning section 15 includes a primary cleaning unit 131, a secondary cleaning unit 132 and a tertiary cleaning unit 133 for cleaning the front surface of the wafer, and further includes a drying unit 135 for drying the cleaned wafer. In this embodiment a roll-type cleaning device, which cleans a wafer by rubbing roll sponges against the upper and lower surfaces of the wafer, is used in each of the primary cleaning unit 131 and the secondary cleaning unit 132, while a two-fluid type cleaning device, which delivers a two-fluid jet to the upper surface of the wafer, is used in the tertiary cleaning unit 133. A pen sponge-type cleaning device using a pen sponge may be used instead of the two-fluid type cleaning device.

A transfer robot 141 is disposed between the primary cleaning unit 131 and the secondary cleaning unit 132, and a transfer robot 142 is disposed between the secondary cleaning unit 132 and the tertiary cleaning unit 133. The transfer robot 142 is disposed adjacent to the upper temporary stage 60A. A transfer robot 143 is disposed between the tertiary cleaning unit 133 and the drying unit 135.

The wafer, whose back surface has been cleaned, is removed from the upper temporary stage 60A by the transfer robot 142. Further, the wafer is transported by the transfer robot 142 and the transfer robot 141 to the primary cleaning unit 131 through the secondary cleaning unit 132. The front surface of the wafer is cleaned sequentially by the primary cleaning unit 131, the secondary cleaning unit 132 and the tertiary cleaning unit 133. The wafer, which has been cleaned by the tertiary cleaning unit 133, is transported by the transfer robot 143 to the drying unit 135, where the wafer is dried. The dried wafer is transported by the transfer robot 21 from the drying unit 135 to one of the wafer cassettes on the load ports 5.

Figure 11:
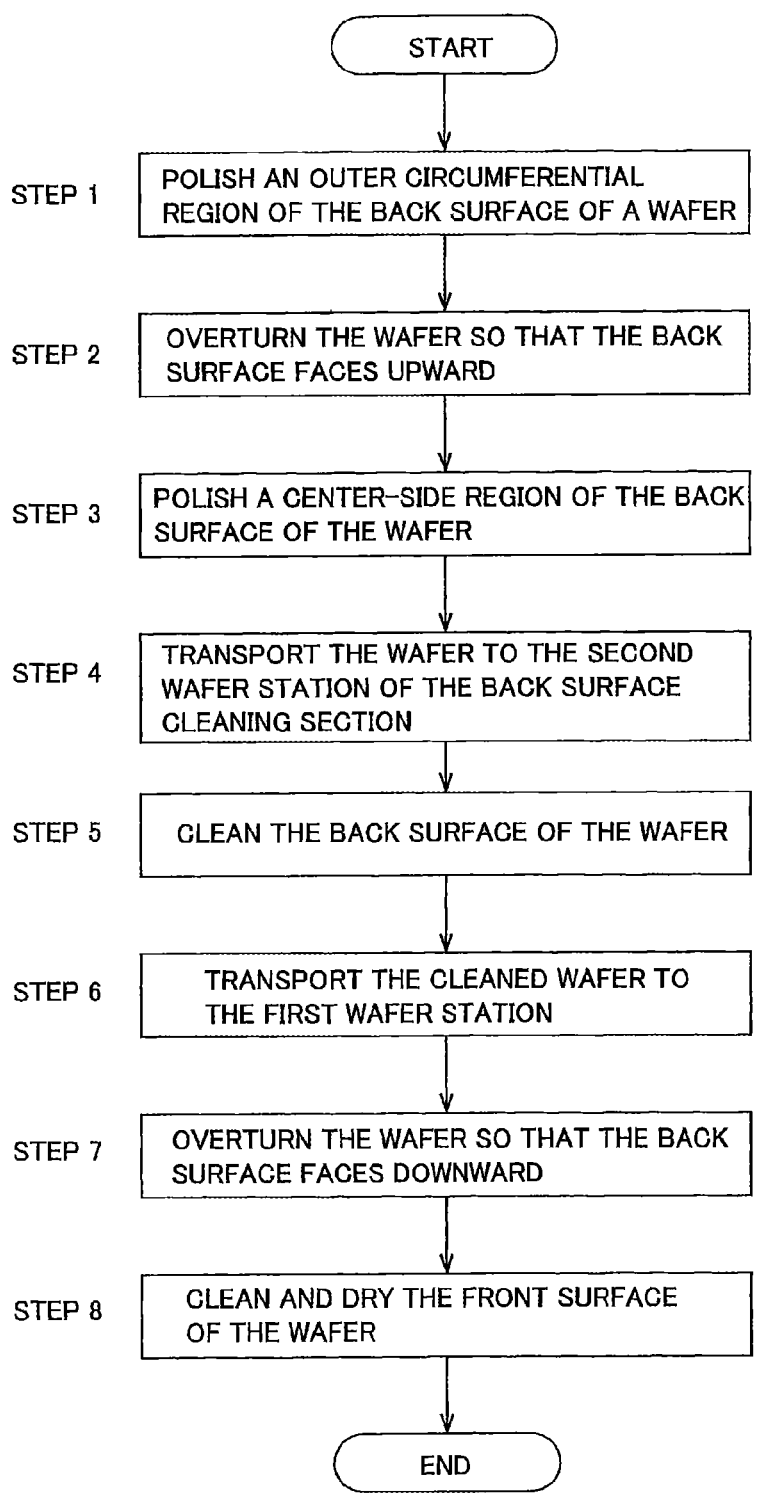
FIG. 11 is a flow chart illustrating an embodiment of an overall substrate processing process.

An embodiment of an overall wafer processing process will now be described with reference to a flow chart of FIG. 11. In step 1, the outer circumferential region of the back surface of a wafer is polished by the first back-surface polishing unit 8. In step 2, the wafer is overturned by the transfer robot 61 so that the back surface of the wafer faces upward. In step 3, the center-side region of the back surface of the wafer is polished by the second back-surface polishing unit 9. In one embodiment, it is also possible to perform polishing of the center-side region of the back surface of the wafer in step 1, and to perform polishing of the outer circumferential region of the back surface of the wafer in step 3.

In step 4, the wafer, whose back surface has been polished, is transported to the second wafer station 82 (see FIG. 7) of the back-surface cleaning section 10. In step 5, scrub cleaning and two-fluid cleaning are performed on the back surface of the wafer by the back-surface cleaning unit 80. The order of the scrub cleaning and the two-fluid cleaning is predetermined in accordance with a cleaning recipe. In step 6, the wafer, whose back surface has been cleaned, is transported to the first wafer station 81 (see FIG. 7) of the back-surface cleaning section 10. In step 7, the wafer is removed by the transfer robot 61 from the first wafer station 81, and is overturned by the transfer robot 61 so that the back surface will face downward. In step 8, the front surface of the wafer is cleaned and dried by the front-surface cleaning section 15. In this manner, the substrate processing apparatus successively performs the series of processes including: polishing of the back surface; cleaning of the back surface; cleaning of the front surface; and drying of the wafer. These operations of the processes are controlled by the operation controller 12.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus comprising:
   a back-surface polishing section configured to polish a back surface of a substrate; and
   a back surface cleaning apparatus configured to clean the back surface of the substrate which has been polished by the back-surface polishing section, the back surface cleaning apparatus including:
   a plurality of back-surface cleaning units each configured to clean the back surface of the substrate;
   a first substrate station configured to temporarily house the substrate whose back surface has been cleaned;
   a second substrate station configured to temporarily house the substrate whose back surface has not yet been cleaned; and
   a first transfer robot configured to transport the substrate, whose back surface has not yet been cleaned, from the second substrate station to one of the plurality of back-surface cleaning units and to transport the substrate, whose back surface has been cleaned, from one of the plurality of back-surface cleaning units to the first substrate station,
   wherein each of the back-surface cleaning units includes:
   a substrate holder configured to rotate the substrate while holding the substrate with the back surface facing upward;
   a scrub cleaning tool configured to be rotatable;
   a two-fluid nozzle disposed above the substrate holder; and
   a housing defining a cleaning chamber in which the substrate holder, the scrub cleaning tool, and the two-fluid nozzle are located.

2. The substrate processing apparatus according to claim 1, further comprising:
   a front-surface cleaning section configured to clean a front-surface of the substrate whose back surface has been cleaned by the back-surface cleaning apparatus.

3. The substrate processing apparatus according to claim 2, further comprising:
   a second transfer robot configured to transfer the substrate, which has been polished by the back-surface polishing section, to the back-surface cleaning apparatus, reverse the substrate which has been clean by the back-surface cleaning apparatus, and transfer the substrate to the front-surface cleaning section.

4. The substrate processing apparatus according to claim 2, wherein:
the back-surface polishing section comprises a first back-surface polishing unit and a second back-surface polishing unit each configured to polish the back surface of the substrate; and
an arrangement direction of the first back-surface polishing unit and the second back-surface polishing unit is perpendicular to an arrangement direction of the plurality of back-surface cleaning units as viewed from above the substrate processing apparatus.

5. The substrate processing apparatus according to claim 2, wherein:
the front-surface cleaning section comprises a plurality of front-surface cleaning units each configured to clean the front surface of the substrate; and
an arrangement direction of the plurality of front-surface cleaning units is perpendicular to an arrangement direction of the plurality of back-surface cleaning units as viewed from above the substrate processing apparatus.

6. The substrate processing apparatus according to claim 5, wherein the plurality of front-surface cleaning units comprises a primary cleaning unit configured to clean the front surface of the substrate, a secondary cleaning unit configured to clean the front substrate which has been cleaned by the primary cleaning unit, and a tertiary cleaning unit configured to clean the front substrate which has been cleaned by the secondary cleaning unit.

7. The substrate processing apparatus according to claim 6, wherein each of the primary cleaning unit and the secondary cleaning unit comprises a roll-type cleaning device having roll sponges for rubbing the substrate, and the tertiary cleaning unit comprises a two-fluid type cleaning device having a two-fluid jet nozzle or a pen sponge-type cleaning device having a pen sponge for rubbing the substrate.

8. The substrate processing apparatus according to claim 1, further comprising:
an operation controller configured to instruct the transfer robot to transport the substrate, whose back surface has not yet been cleaned, from the second substrate station to one of the plurality of back-surface cleaning units and to transport the substrate, whose back surface has been cleaned, from one of the plurality of back-surface cleaning units to the first substrate station.

9. The substrate processing apparatus according to claim 8, wherein each of the first substrate station and the second substrate station includes:
a container configured to house the substrate therein;
a shutter configured to cover an opening of the container; and
a pure-water spray nozzle arranged in the container.

10. The substrate processing apparatus according to claim 1, wherein each of the back-surface cleaning units includes:
an arm to which the scrub cleaning tool and the two-fluid nozzle are secured; and
a pivot motor configured to rotate the arm, the scrub cleaning tool, and the two-fluid nozzle clockwise and counterclockwise through a predetermined angle around a predetermined pivot axis.

11. The substrate processing apparatus according to claim 10, wherein a distance between the scrub cleaning tool and the predetermined pivot axis is equal to a distance between the two-fluid nozzle and the predetermined pivot axis.

12. The substrate processing apparatus according to claim 1, wherein the substrate holder includes a plurality of rotatable holding rollers configured to hold a periphery of the substrate.

* * * * *